United States Patent
Zheng et al.

(10) Patent No.: US 9,629,278 B2
(45) Date of Patent: Apr. 18, 2017

(54) ELECTRONIC DEVICE AND ENCLOSURE AND PANEL STRUCTURE THEREOF

(71) Applicant: WISTRON CORPORATION, New Taipei (TW)

(72) Inventors: Yong-Liang Zheng, New Taipei (TW); Qi-Qiong Li, New Taipei (TW); Chuan-Chi Wang, New Taipei (TW)

(73) Assignee: Wistron Corporation, New Taipei (TW)

( * ) Notice: Subject to any disclaimer, the term of this patent is extended or adjusted under 35 U.S.C. 154(b) by 129 days.

(21) Appl. No.: 14/584,774

(22) Filed: Dec. 29, 2014

(65) Prior Publication Data
US 2015/0271937 A1    Sep. 24, 2015

(30) Foreign Application Priority Data
Mar. 19, 2014    (CN) .......................... 2014 1 0102453

(51) Int. Cl.
*H05K 5/02* (2006.01)
*H05K 7/14* (2006.01)
*G06F 1/18* (2006.01)

(52) U.S. Cl.
CPC ............. *H05K 7/1494* (2013.01); *G06F 1/18* (2013.01); *G06F 1/181* (2013.01)

(58) Field of Classification Search
CPC ...... E05B 3/50; E05B 3/5009; E05B 3/50018; E05B 3/509; E05D 7/1044; E05D 7/1061; E05D 7/10; E05D 15/502; H05K 5/0239; H05K 5/0217; H05K 5/03; H05K 7/1494; G06F 1/18
See application file for complete search history.

(56) References Cited

U.S. PATENT DOCUMENTS

| | | | | |
|---|---|---|---|---|
| 3,270,462 | A * | 9/1966 | Obadal ................. | B62D 25/10 16/257 |
| 5,926,916 | A * | 7/1999 | Lee ....................... | E05D 15/502 16/230 |
| 6,000,769 | A * | 12/1999 | Chen ..................... | G06F 1/181 16/232 |
| 7,476,804 | B2 * | 1/2009 | Adducci ................ | H02B 1/202 174/50 |
| 7,661,375 | B2 * | 2/2010 | McCarthy .............. | H02G 3/10 109/59 R |
| 8,355,252 | B2 | 1/2013 | Chan et al. | |

(Continued)

*Primary Examiner* — Leslie A Nicholson, III
*Assistant Examiner* — Ryan A Doyle
(74) *Attorney, Agent, or Firm* — Muncy, Geissler, Olds & Lowe, P.C.

(57) ABSTRACT

A panel structure is removably connected with a main housing of an electronic device. The panel structure comprises a panel body, two movable members and at least two elastic members. The panel body comprises two fixing parts; each movable member is movably connected with the panel body, and each movable member comprises a pivoting part and a corresponding fixing part, wherein the two movable members are movably apart from each other in a first axial direction such that each movable member is fixed with each fixing part with each corresponding fixing part, making each pivoting part which moves along with each movable member pivotally connected to the main housing. Each elastic member has two ends respectively connected to the movable members and the panel body.

19 Claims, 10 Drawing Sheets

(56) References Cited

U.S. PATENT DOCUMENTS

2007/0089269 A1\* 4/2007 Shen ...................... E05D 5/06
                                                   16/268
2013/0257248 A1\* 10/2013 Bedkowski ............. H02B 1/38
                                                  312/329

\* cited by examiner

ELECTRONIC DEVICE AND ENCLOSURE AND PANEL STRUCTURE THEREOF

BACKGROUND OF THE INVENTION

1. Field of the Invention

The present invention relates to a panel structure, and more particularly to a panel structure removably connected with the main housing of an electronic device. The present invention further comprises an electronic device enclosure comprising the panel structure.

2. Description of the Related Art

Conventional non-portable electronic devices, such as storage systems, desktop computers, or servers, are generally provided with an operation panel on the front side of the enclosure to allow easy manipulation by users for different purposes. Occasionally, in order to replace components such as hard drives in these electronic devices for the purpose of system upgrades or maintenance and repairs, the panel has to be removed first so that the internal components may be replaced. Therefore, it is important for these devices to have an easily removable panel structure.

For some of the devices mentioned above, the panel is not removable or dismountable from the front side of the enclosure; therefore, when a user wants to replace the internal components, he or she has to first remove a part of the enclosure from the lateral or top side before dismounting the panel. This structural design, which is complicated and requires more time to mount and dismount the panel, is thus not user-friendly or convenient.

SUMMARY OF THE INVENTION

A main objective of the present invention is to provide a panel structure removably connected with the main housing of an electronic device.

To achieve the aforesaid objective, the panel structure of the present invention comprises a panel body, a first movable member, at least one first elastic member, a second movable member and at least one second elastic member. The panel body comprises a first fixing part and a second fixing part. The first movable member is movably connected with the panel body and comprises a first pivoting part and a first corresponding fixing part, wherein the first movable member is movable in a first axial direction toward a first direction such that the first movable member is fixed by the first fixing part and the first corresponding fixing part, making the first pivoting part which moves along with the first movable member pivotally connected to the main housing. Each first elastic member has two ends respectively connected to the first movable member and the panel body. The second movable member is movably connected with the panel body and comprises a second pivoting part and a second corresponding fixing part, wherein the second movable member is movable in the first axial direction toward a second direction opposite to the first direction such that the second movable member is fixed by the second fixing part and the second corresponding fixing part, making the second pivoting part which moves along with the second movable member pivotally connected to the main housing. Each second elastic member has two ends respectively connected to the second movable member and the Panel body.

The electronic device enclosure of the present invention comprises a main housing and the above-described panel structure. The main housing comprises a first pushing member and a second pushing member. When the first pivoting part and the second pivoting part have both been pivotally connected to the main lousing, the panel body is rotatable to a closed position relative to the main housing; after the panel body has been rotated to the closed position relative to the main housing, the first pushing member pushes the first fixing part to disengage the first fixing part from the first corresponding fixing part so as to enable the first movable member to move when the panel body slides relative to the main housing and disconnect the first pivoting part from the main housing, and the second pushing member pushes the second fixing part to disengage the second fixing part from the second corresponding fixing part so as to enable the second movable member to move when the panel body slides relative to the main housing and disconnect the second pivoting part from the main housing.

The present invention also comprises an electronic device having the above-described electronic device enclosure.

DETAILED DESCRIPTION OF THE PREFERRED EMBODIMENT

The advantages and innovative features of the invention will become more apparent from the following detailed description when taken in conjunction with the accompanying drawings.

Figure 1:
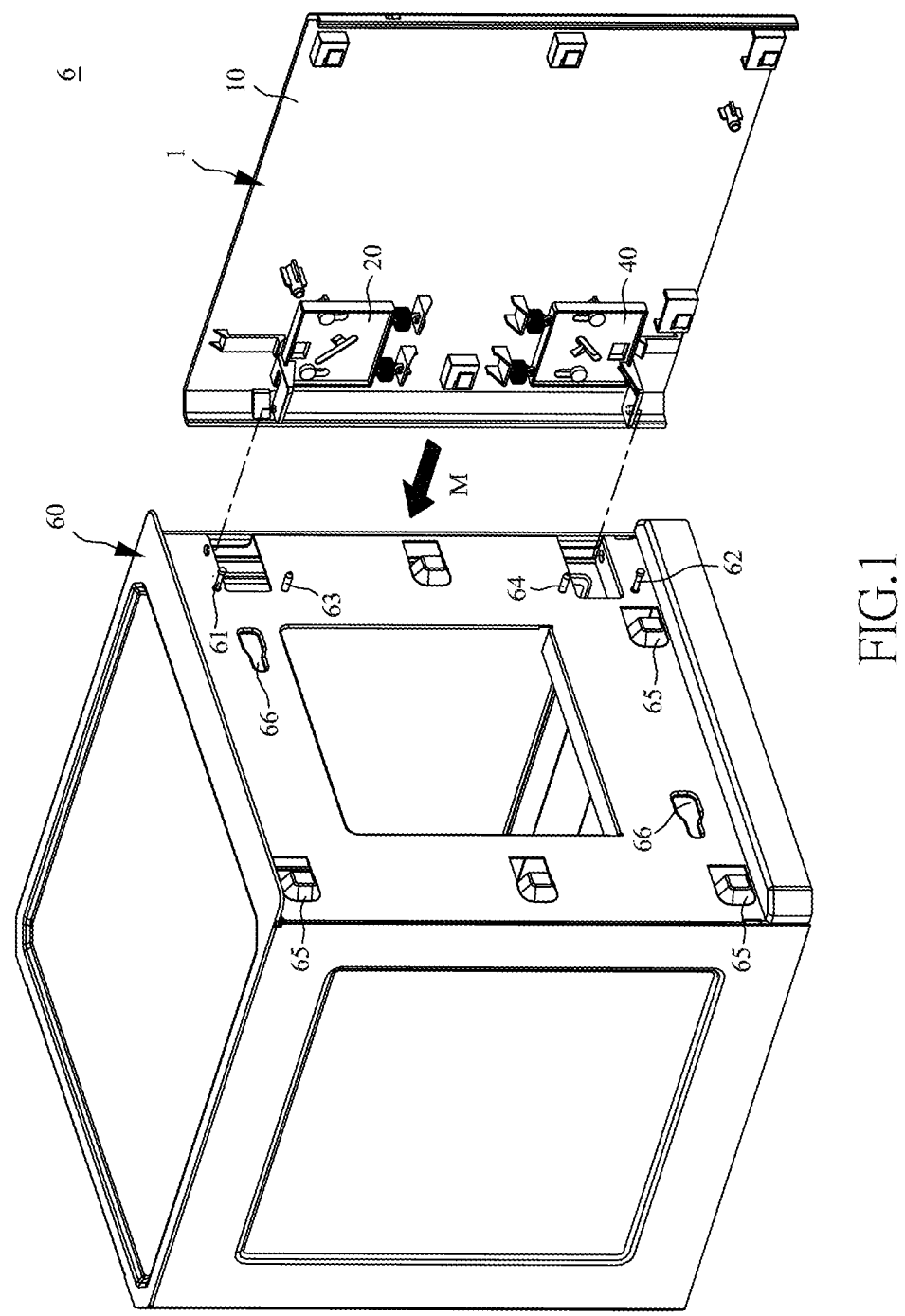
FIG. 1 illustrates the panel structure of the present invention applied to an electronic device enclosure.

FIG. 1 illustrates the panel structure 1 of the present invention applied to an electronic device enclosure 6. As shown, the panel structure 1 of the present invention is mainly applicable to an electronic device enclosure 6, particularly to the enclosure of a non-portable electronic device such as a storage system, a server, or a desktop computer, but the present invention is not limited thereto. As illustrated in FIG. 1, the electronic device enclosure 6 comprises a main housing 60 and an above-mentioned panel structure 1 which is removably connected with the main housing 60. The panel structure 1 of the present invention is first pivotally connected with the main housing 60 to enable a user to rotate the panel structure 1 relative to the main housing 60; after the panel structure 1 has been rotated to the closed position and adhered on the main housing 60, the user may then slide the panel structure 1 by pushing the panel structure 1 relative to the main housing 60 so as to secure the panel structure 1 on the main housing 60. Details of the operation of the panel structure 1 of the present invention are described in the following paragraphs.

Figure 2:
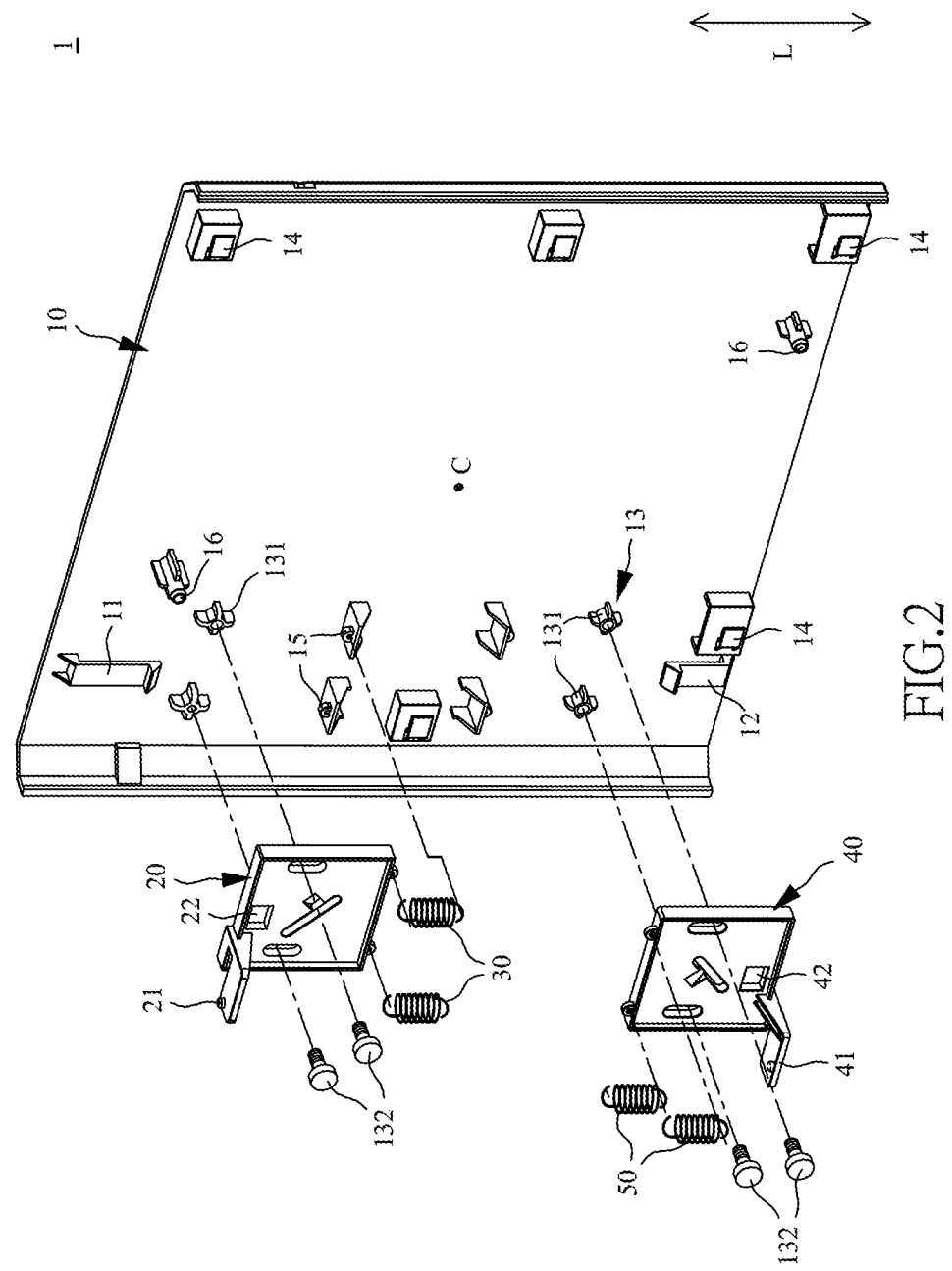
FIG. 2 illustrates the exploded view of the panel structure of the present invention.

FIG. 2 illustrates the exploded view of the panel structure 1 of the present invention. As illustrated by FIG. 2, the panel structure 1 of the present invention comprises a panel body 10, a first movable member 20, at least one first elastic member 30, a second movable member 40 and at least one second elastic member 50, wherein the first movable member 20, the at least one first elastic member 30, the second movable member 40 and the at least one second elastic member 50 are all arranged on the same side of the panel body 10, and the structure and position of the first movable member 20 and the second movable member 40 are symmetrical to each other.

The panel body 10 comprises a first fixing part 11 and a second fixing part 12. The first fixing part 11 is disposed in a position corresponding to the first movable member 20 so as to fix the first movable member 20; the second fixing part 12 is disposed in a position corresponding to the second movable member 40 so as to fix the second movable member 40. In one embodiment of the present invention, the first fixing part 11 and the second fixing part 12 are individually configured as an engagement hook, but the present invention is not limited thereto.

The panel body 10 further comprises a plurality of support members 13. The plurality of support members 13 are arranged in positions corresponding to the first movable member 20 and the second movable member 40 such that each support member 13 passes through the first movable member 20 or the second movable member 40, thereby restraining the movement of and securing the first movable member 20 and the second movable member 40. That is, the first movable member 20 or the second movable member 40 is movably connected with the panel body 10 with each support member 13.

Each support member 13 comprises a base 131 and a securing member 132, each base 131 being abutted against the first movable member 20 or the second movable member 40 such that the first movable member 20 and the second movable member 40 can both be spaced apart from the panel body 10 to allow the operation of the first movable member 20 and the second movable member 40. The securing members 132 are combined with the bases 131 such that when the first movable member 20 or the second movable member 40 is connected with the panel body 10, the securing members 132 may prevent the first movable member 20 or the second movable member 40 from being separated and disengaged from each support member 13. In one embodiment of the present invention, each securing member 132 is configured as a step screw, but the present invention is not limited thereto.

The panel body 10 further comprises a plurality of third fixing parts 14 for fixing the main housing after the panel body 10 has slid relative to the main housing of the electronic device enclosure (refer to FIG. 1). In one embodiment of the present invention, each third fixing part 14 is configured as an L-shaped engagement hook structure corresponding to a corresponding structure disposed on the main housing, but the present invention is not limited thereto. In addition, the panel body 10 further comprises a plurality of elastic member retaining bases 15 for fixing and connecting the first elastic member 20 or the second elastic member 40. The panel body 10 further comprises a plurality of restraining members 16 for restraining the movement of the panel body 10 after it has slid relative to the main housing. In one embodiment of the present invention, each restraining member 16 is configured as a restraining rod corresponding to a corresponding structure disposed on the main housing, but the present invention is not limited thereto.

Figure 3:
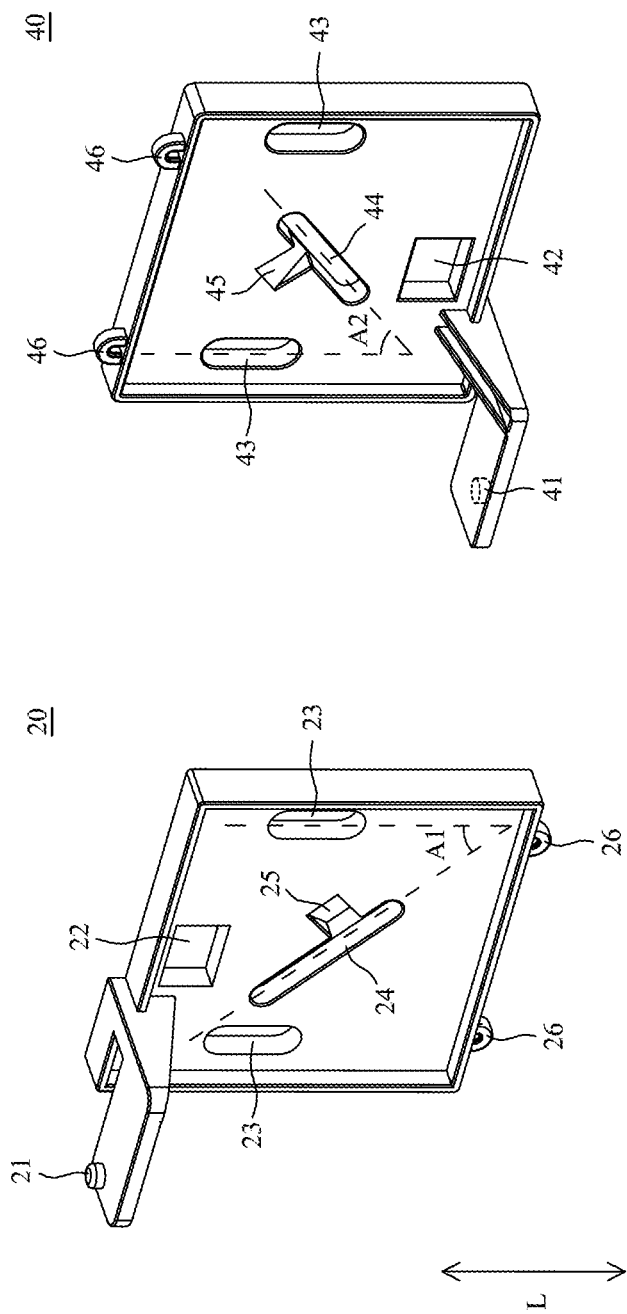
FIG. 3 illustrates the first movable member and the second movable member of the panel structure of the present invention.

Refer now to FIGS. 2 and 3, wherein FIG. 3 illustrates the first movable member 20 and the second movable member 40 of the panel structure 1 of the present invention. As illustrated in FIGS. 2 and 3, the first movable member 20 of the panel structure 1 of the present invention is movably connected with the panel body 10, and the first movable member 20 comprises a first pivoting part 21 and a first corresponding fixing part 22. The first pivoting part 21 may be moved along with the first moveable member 20 relative to the panel body 10 to a predetermined position and then pivotally connected to the main housing of the electronic device enclosure, as shown in FIG. 1. The position and structure of the first corresponding fixing part 22 correspond to the first fixing part 11 of the panel body 10. In one embodiment of the present invention, the first corresponding fixing part 22 is configured as an engagement slot structure corresponding to the aforesaid engagement hook structure to engage the first fixing part 11, but the present invention is not limited thereto.

The first movable member 20 further comprises a plurality of first guide slots 23, and each first guide slot 23 may be passed through by a corresponding support member 13 such that the first movable member 20 may only move in the longitudinal direction of the first guide slot 23 (hereinafter referred to as the first axial direction L) relative to the panel body 10; the securing member 132 of the support member 13 has a maximal cross-sectional diameter at one end which is greater than the width of the first guide slot 23 such that the securing member 132 may secure the first movable member 20 and prevent the first movable member 20 from falling off or being separated from the panel body 10. Each first guide slot 23 is substantially parallel to the first axial direction L.

The first movable member 20 further comprises a first oblique slot 24; the first oblique slot 24 and the first axial direction L define a first included angle A1 therebetween, and the first oblique slot 24 is extended toward the central portion C of the panel body 10; the first oblique slot 24 is insertable by a corresponding structure of the main housing so as to drive the first movable member 20 to move relative to the main housing. The first movable member 20 further comprises a first indentation part 25 connected with the first oblique slot 24 so as to facilitate the insertion of the corresponding structure of the main housing into the first oblique slot 24. In addition, the first movable member 20 further comprises at least one first elastic member retaining part 26 for connecting and retaining the first elastic member 30.

As illustrated in FIGS. 2 and 3, the second movable member 40 of the panel structure 1 of the present invention has a structural design symmetrically corresponding with the first movable member 20. The second movable member 40 is also movably connected with the panel body 10 and comprises a second pivoting part 41 and a second corresponding fixing part 42. The second pivoting part 41 may be moved along with the second movable member 40 relative to the panel body 10 to another predetermined. position and then pivotally connected to the main housing of the electronic device enclosure, as shown in FIG. 1. The position and structure of the second corresponding fixing part 42 is determined corresponding to the second fixing part 12 of the panel body 10. In one embodiment of the present invention, the second corresponding fixing part 42 is configured as an engagement slot structure to engage the second fixing part 12 configured as an engagement hook structure, but the present invention is not limited thereto.

The second movable member 40 further comprises a plurality of second guide slots 43, and each second guide slot 43 may be passed through by a corresponding support member 13 such that the second movable member 40 may only move in the longitudinal direction of the second guide slot 43 (i.e., the first axial direction L) relative to the panel body 10. The securing member 132 of the support member 13 has a maximal cross-sectional diameter at one end which is greater than the width of the second guide slot 43 such that the securing member 132 may secure the second movable member 40 and prevent the second movable member 40 from falling off or being separated from the panel body 10. Each second guide slot 43 is substantially parallel to the first axial direction L.

The second movable member 40 further comprises a second oblique slot 44; the second oblique slot 44 and the first axial direction L define a second included angle A2 therebetween, and the second oblique slot 44 is also extended toward the central portion C of the panel body 10; the second oblique slot 44 is insertable by another corresponding structure of the main housing an as to drive the second movable member 40 to move relative to the main housing. The second movable member 40 further comprises a second indentation part 45 connected with the second oblique slot 44 so as to facilitate the insertion of the corresponding structure of the main housing into the second oblique slot 44. In addition, the second movable member 40 further comprises at least one second elastic member retaining part 46 fur connecting and retaining the second elastic member 50.

Also as illustrated in FIGS. 2 and 3, each first elastic member 30 has two ends respectively connected to the first elastic member retaining part 26 of the first movable member 20 and the elastic member retaining base 15 of the panel body 10 such that the at least one first elastic member 30 may provide the first movable member 20 with elastic resilience. Each second elastic member 50 has two ends respectively connected to the second elastic member retaining part 46 of the second movable member 40 and the elastic member retaining base 15 of the panel body 10 to provide the second movable member 40 with elastic resilience.

Figure 4:
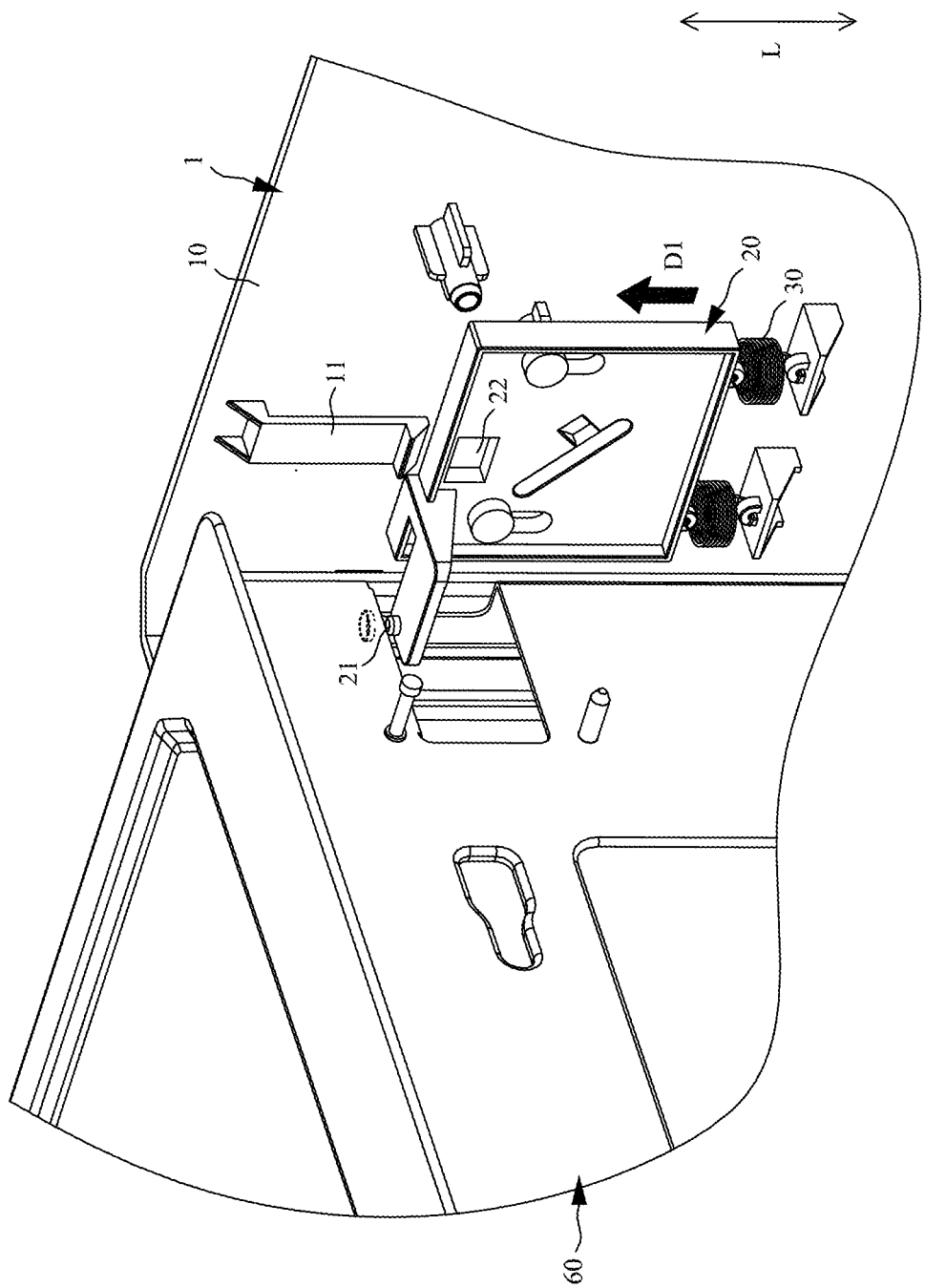
FIG. 4 illustrates the first movable member of the panel structure of the present invention in the initial position.
Figure 5:
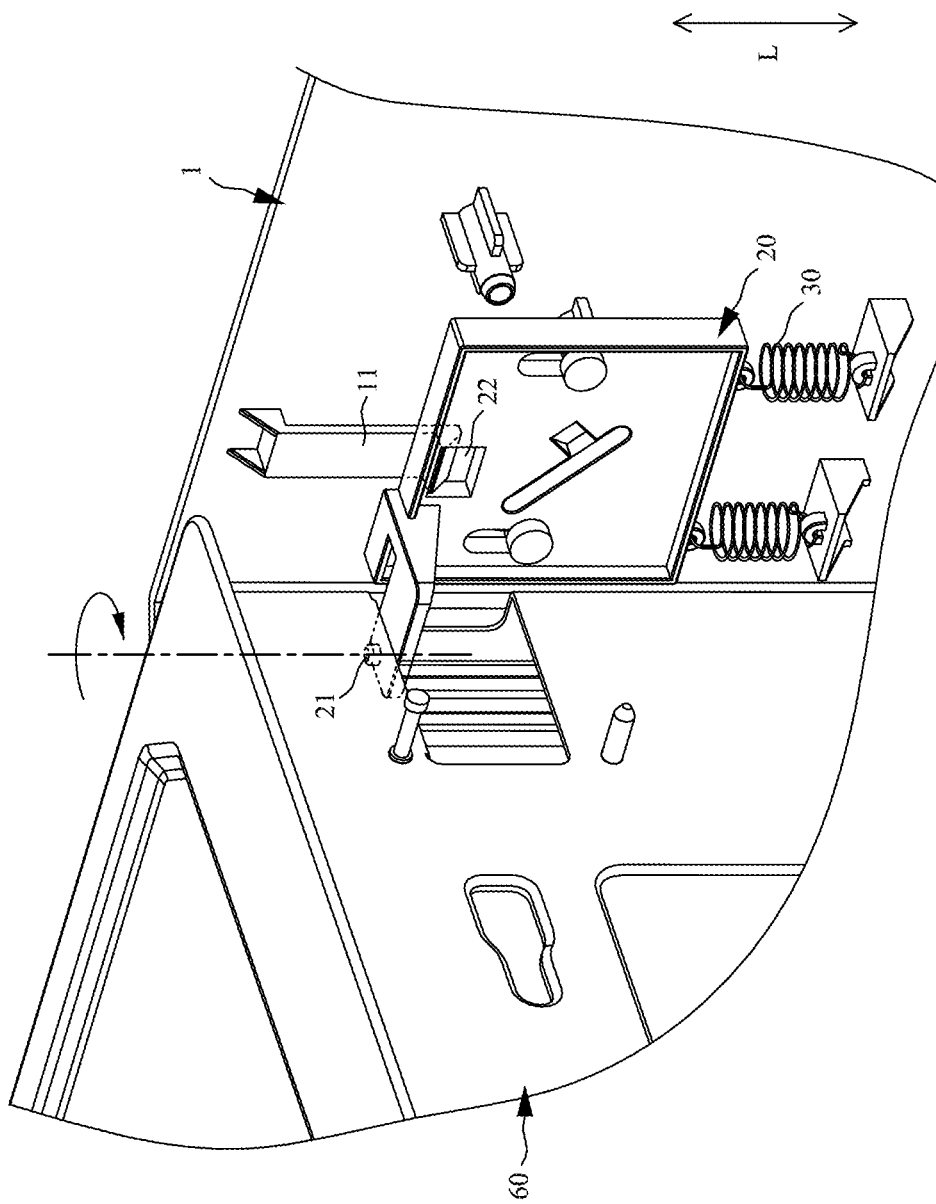
FIG. 5 illustrates the first movable member of the panel structure of the present invention fixed with the first fixing part with the first corresponding fixing part.
Figure 6:
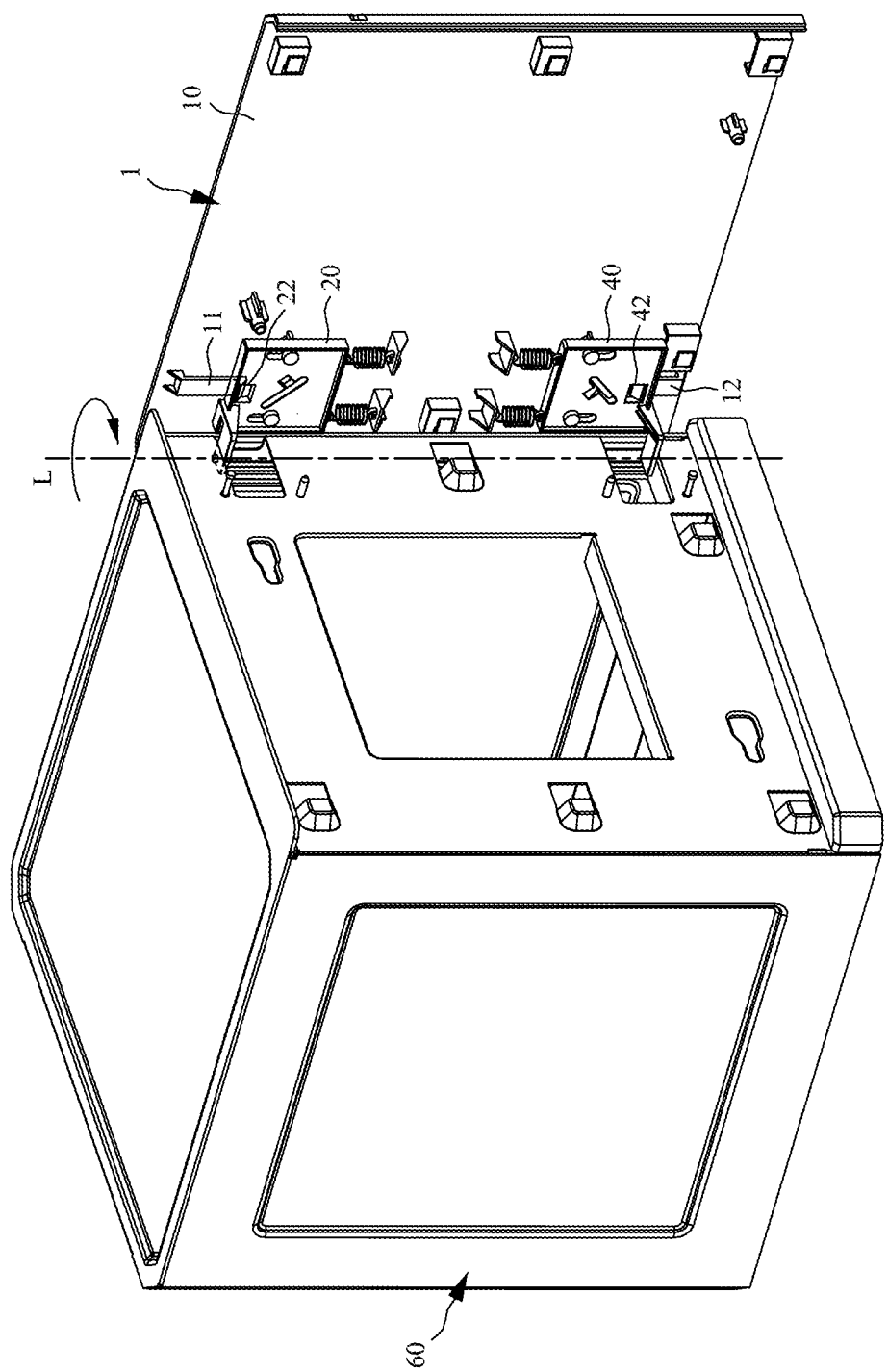
FIG. 6 illustrates the panel structure of the present invention pivotally connected with the main housing.

Refer now to FIGS. 4 to 6, wherein FIG. 4 illustrates the first movable member 20 of the panel structure 1 of the present invention in the initial position; FIG. 5 illustrates the first movable member 20 of the panel structure 1 of the present invention fixed with the first fixing part with the first corresponding fixing part; and FIG. 6 illustrates the panel structure 1 of the present invention pivotally connected with the mail housing 60. It should be noted that, since the first movable member 20 and the second movable member 40 have symmetrical structures and are operated oppositely, the descriptions below employ only the first movable member 20 as an example for the purpose of simplicity, but the operation of the second movable member 40 can be inferred by a person skilled in the art without undue experimentation.

As shown in FIG. 1, when the panel structure 1 of the present invention has not yet been connected with the main housing 60, the first movable member 20 and the second movable member 40 are respectively in the initial positions relative to the panel body 10 and are not in contact with the main housing 60.

To connect or combine the panel structure 1 of the present invention to the main housing 60, a user may first move the panel structure 1 of the present invention in the direction of arrow M shown in FIG. 1 toward the main housing 60 to the position shown in FIG. 4. After that, the user may apply force to the first movable member 20 to move the first movable 20 in the first axial direction L toward the first direction D1 until the first corresponding fixing part 22 of the first movable member 20 has been engaged and fixed with the first fixing part 11 of the panel body 10. Thus, the first movable member 20 is retained in a first fixed position illustrated in FIG. 5, and each first elastic member 30 is in a state of tension. When the first corresponding fixing part 22 and the first fixing part 11 are fixed with each other as a result of the movement of the first movable member 20, the first pivoting part 21 thereof will be pivotally connected with the main housing 60.

Similarly, the user needs to apply force to the second movable member 40 to move the second movable member 40 in the first axial direction L opposite to the first direction D1 until the second corresponding fixing part 42 of the second movable member 40 has been fixed with the second fixing part 12 of the panel body 10, thereby pivotally connecting the second pivoting part 41 of the second movable member 40 to the main housing 60. Accordingly, as shown in FIG. 6, after the first movable member 20 and the second movable member 40 of the panel structure 1 of the present invention have both been pivotally connected with the main housing 60, the panel body 10 becomes rotatable about the first axial direction L as the rotation axis relative to the main housing 60.

Refer back to FIG. 1. In one embodiment of the present invention, in order to match the operational design of the panel structure 1 of the present invention, the main housing 60 may comprise a first pushing member 61 and a second pushing member 62, wherein the first pushing member 61 is arranged in a position corresponding to the first fixing part 11 of the panel body 10, and the second pushing member 62 is arranged in a position corresponding to the second fixing part 12 of the panel body 10. The first pushing member 61 is configured to push the first fixing part 11, and the second pushing member 62 is configured to push the second fixing part 12.

The main housing 60 further comprises a first pin 63 and a second pin 64, wherein the first pin 63 corresponds to the first oblique slot 24 of the first movable member 20, and the second pin 64 corresponds to the second oblique slot 44 of the second movable member 40. In addition, the main housing 60 further comprises a plurality of auxiliary fixing members 65; each auxiliary fixing member 65 is operated in conjunction with each third fixing part 14 of the panel body 10. In one embodiment of the present invention, each auxiliary fixing member 65 is configured as a groove structure to be combined with the third fixing part 14 configured as an L-shaped engagement hook structure, but the present invention is not limited thereto. The main housing 60 further comprises a plurality of corresponding restraining members 66; each corresponding restraining member 66 corresponds to each restraining member 16 of the panel body 10. In one embodiment of the present invention, each corresponding restraining member 66 is configured as a restraining groove to be combined and restrained with the restraining member 16 configured as a restraining rod, but the present invention is not limited thereto.

Figure 7:
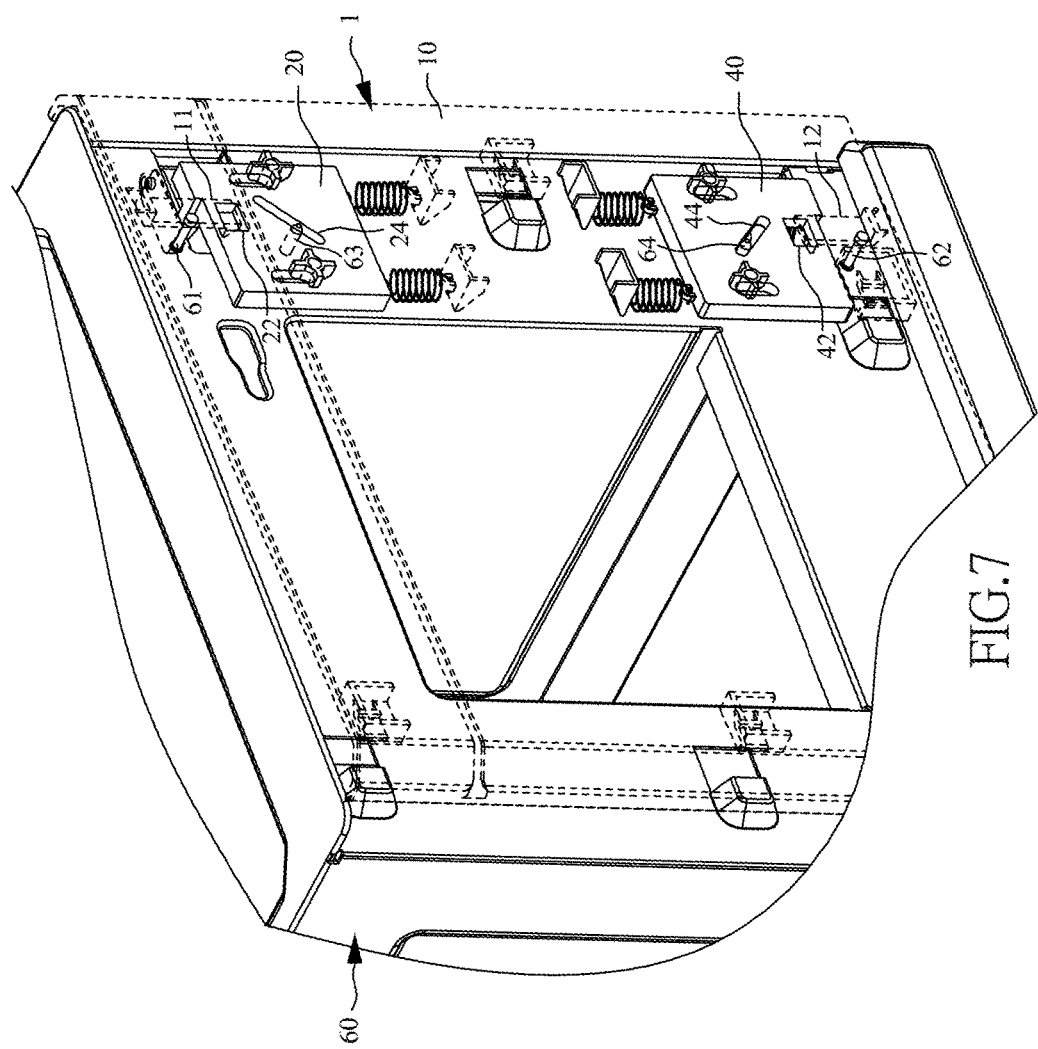
FIG. 7 illustrates the panel structure of the present invention rotated close to the closed position relative to the main housing.
Figure 8:
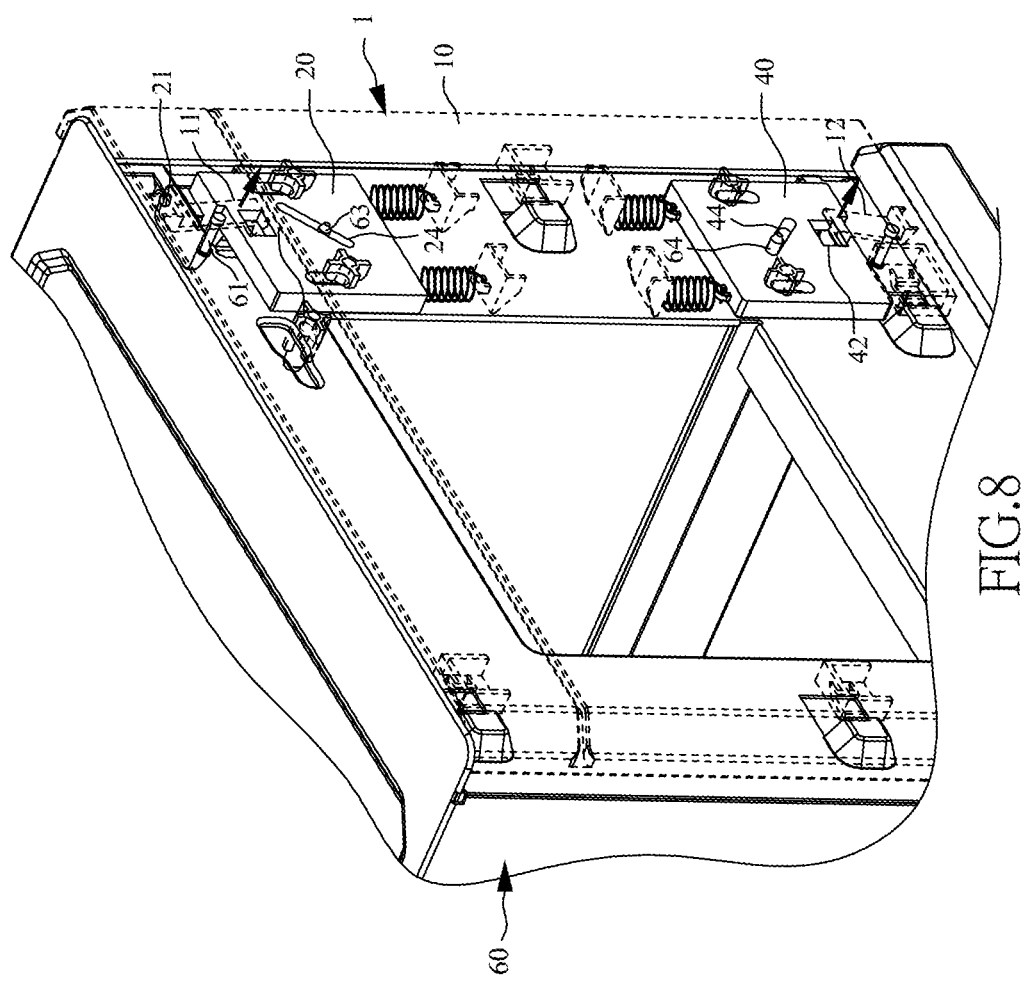
FIG. 8 illustrates the panel structure of the present invention rotated to the closed position relative to the main housing.

Refer to FIGS. 7 and 8, wherein FIG. 7 illustrates the panel structure 1 of the present invention rotated close to the closed position relative to the main housing 60, and FIG. 8 illustrates the panel structure 1 of the present invention already rotated to the closed position dative to the main housing 60. It should be noted that to facilitate description of the operation of the first movable member 20 and the second movable member 40 in greater detail, the panel body 10 and structural members thereof are represented by broken tines in the figures.

As illustrated in FIG. 7, when the user rotates the panel structure 1 of the present invention close to the closed position relative to the main housing 60, the first pushing member 61 of the main housing 60 comes in contact with and pushes the first fixing part 11 of the panel body 10 such that the first fixing part 11 is gradually disengaged from the first corresponding fixing part 22 of the first movable member 20, and the second pushing member 62 also comes in contact with and pushes the second fixing part 12 such that the second fixing part 12 is gradually disengaged from the second corresponding fixing part 42 of the second movable member 40. Meanwhile, the first pin 63 of the main housing 60 is gradually inserted into the first oblique slot 24 of the first movable member 20, and the second pin 64 is gradually inserted into the second oblique slot 44 of the second movable member 40.

As illustrated in FIG. 8, after the panel structure 1 of the present invention has been rotated to the closed position relative to the main housing 60, the first fixing part 11 is pushed by the first pushing member 61 and therefore completely disengaged from the first corresponding fixing part 22, and the first pin 63 is completely inserted into the first oblique slot 24; similarly, the second fixing part 12 is pushed by the second pushing member 62 and therefore completely disengaged from the second corresponding fixing part 42, and the second pin 64 is completely inserted into the second oblique slot 44. Due to the disengagement of the first fixing part 11 from the first corresponding fixing part 22, the first movable member 20 is driven by the elastic resilience of each first elastic member 30 and pulled at a direction opposite to the first direction; similarly, due to the disengagement of the second fixing part 12 from the second corresponding fixing part 42, the second movable member 40 is driven by the elastic resilience of each second elastic member 50 and pulled in the first direction.

Figure 9:
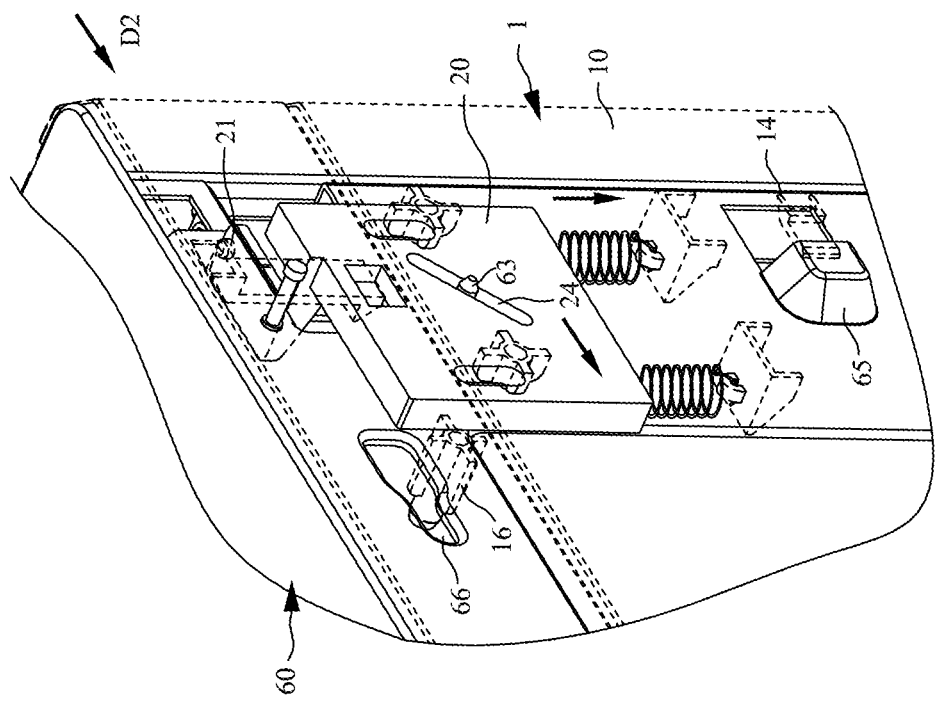
FIG. 9 partially illustrates the sliding progress of the panel structure of the present invention relative to the main housing.
Figure 10:
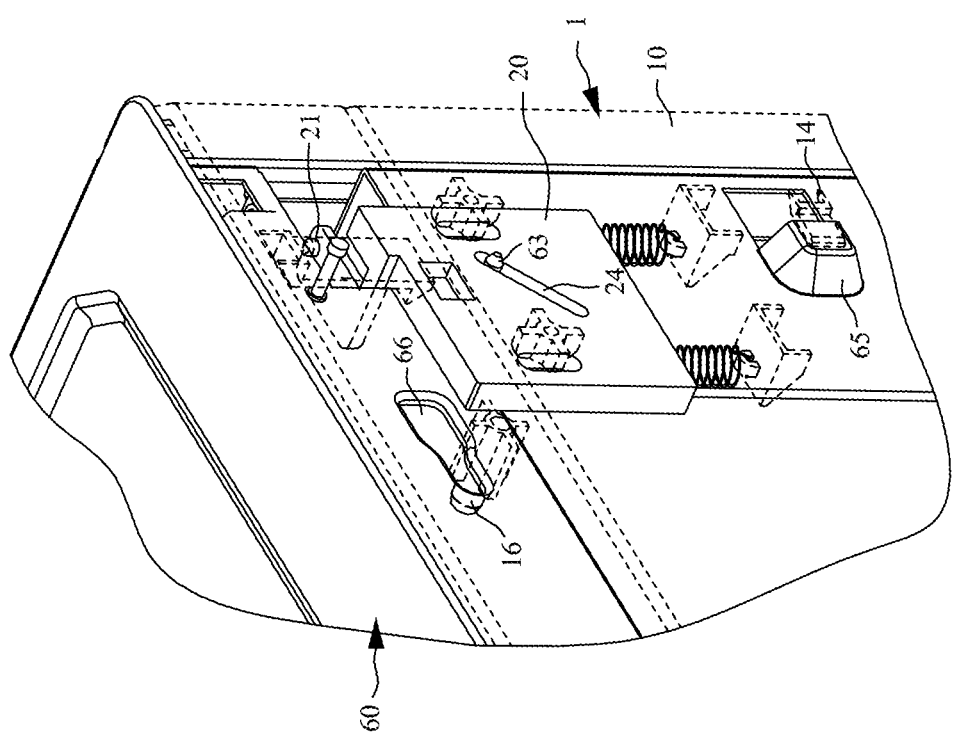
FIG. 10 partially illustrates the panel structure of the present invention having slid relative to the main housing.

Refer now to FIGS. 9 and 10, wherein FIG. 9 partially illustrates the sliding progress of the panel structure 1 of the present invention relative to the main housing 60, and FIG. 10 partially illustrates the panel structure 1 of the present invention having slid relative to the main housing 60. It should be noted that to facilitate description of the operation of the first movable member 20 in greater detail, the panel body 10 and structural members thereof are represented by broken lines in the figures. In addition, since the first movable member 20 and the second movable member 40 have symmetrical structures and are operated oppositely, the descriptions below employ only the first movable member 20 as an example for the purpose of simplicity, but the operation of the second movable member 40 in a counter direction can be inferred by a person skilled in the art.

As illustrated in FIG. 9, after the panel structure 1 of the present invention has been rotated to the closed position relative to the main housing 60, in order to secure the panel structure 1 to the main housing 60, the user has to apply force in the second direction D2 substantially parallel to the panel body 10 an as to slide the panel structure 1 of the present invention relative to the main housing 60. Meanwhile, the first movable member 20, through the interaction between the first pin 63 and the first oblique slot 24, is moved opposite to the first direction to disengage the first pivoting part 21 of the first movable member 20 from the main housing 60; similarly, the second movable member, as illustrated in FIG. 8, is operated in the opposite direction and disengaged from the main housing 60. Accordingly, the panel structure 1 of the present invention can be slid relative the main housing 60.

In the process of the panel structure 1 of the present invention sliding relative to the main housing 60, each third fixing part 14 of the panel body 10 is gradually inserted into each auxiliary fixing member 65 of the main housing 60; therefore, after the panel structure 1 of the present invention has slid relative to the main housing 60 to a predetermined position such that each third fixing part 14 is inserted correspondingly into each auxiliary fixing member 65, the panel structure 1 of the present invention can be secured on the main housing 60. In addition, in the process of the panel structure 1 of the present invention sliding relative to the main housing 60, each restraining member 16 of the panel body 10 is also gradually and correspondingly engaged with and inserted into each corresponding restraining member 66 of the main housing 60. Thus, after the panel structure 1 of the present invention has slid relative to the main housing 60 to a predetermined position so that each restraining member 16 is correspondingly inserted into and engaged with each corresponding restraining member 66, the panel structure 1 of the present invention can be restrained and secured relative to the main housing 60 in the first axial direction L.

Conversely, when the user wants to open the panel structure 1 of the present invention relative to the main housing 60, reverse operations with respect to the aforesaid descriptions may be performed. First, the panel structure 1 of the present invention is slid relative to the main housing 60 opposite to the second direction D2 such that each third fixing part 14 of the panel body 10 is gradually disengaged from each auxiliary fixing member 65 of the main housing 60.

Concurrently, in the process of the panel structure 1 of the present invention sliding reversely relative to the main housing 60, through the interaction between the first pin 63 and the first oblique slot 24, the first movable member 20 is moved in the first direction such that the first pivoting part 21 of the first movable member 20 is again pivotally connected to the main housing 60. Similarly, the second movable member, as illustrated in FIG. 8, can be operated reversely and pivotally connected to the main housing 60.

After the first movable member 20 and the second movable member of the panel structure 1 of the present invention have been re-connected pivotally to the main housing 60, the user may counter-rotate the panel structure 1 from the closed position in FIG. 9. Before the first pin 63 is completely removed from the first oblique slot 24, such as by reversing the operations in FIGS. 8 to 6, the first fixing part 11 of the panel body 10 is removed and disengaged from the first pushing member 61 and re-engaged and fixed with the first corresponding fixing part 22 such that the first pivoting part 21 of the first movable member 20 may be pivotally connected to the main housing 60. Similarly, the second pivoting part 41 of the second movable member 40 may also be pivotally connected to the main housing 60 such that the panel structure 1 can be rotated relative to the main housing 60 and apart from the closed position.

Therefore, the structural designs and configuration linkage described above enables the panel structure 1 of the present invention to be rotated and slid relative to the main housing to provide convenience in use and reduce costs.

It is noted that the above-mentioned embodiments are only for illustration. It is intended that the present invention cover modifications and variations provided they fall within the scope of the following claims and their equivalents. Therefore, it will be apparent to those skilled in the art that various modifications and variations can be made to the structure of the present invention without departing from the scope or spirit of the invention.

What is claimed is:

1. A panel structure, removably connected with a main housing of an electronic device enclosure, the panel structure comprising:
   a panel body comprising a first fixing part and a second fixing part;
   a first movable member movably connected with the panel body, the first movable member comprising a first pivoting part and a first corresponding fixing part, wherein the first movable member is movable in a first axial direction toward a first direction such that the first movable member is fixed by the first fixing part and the first corresponding fixing part;
   at least one first elastic member with two ends respectively connected to the first movable member and the panel body;
   a second movable member movably connected with the panel body, the second movable member comprising a second pivoting part and a second corresponding fixing part, wherein the second movable member is movable in the first axial direction toward a second direction opposite to the first direction such that the second movable member is fixed by the second fixing part and the second corresponding fixing part; and
   at least one second elastic member with two ends respectively connected to the second movable member and the panel body;
   wherein movement of the first movable member causes the first pivoting part to move towards the main housing, such that the first pivoting part is pivotally connectable to the main housing; movement of the second movable member causes the second pivoting part to move towards the main housing, such that the second pivoting part is pivotally connectable to the main housing.

2. The panel structure as claimed in claim 1, wherein the main housing has a first pin and a second pin, the first movable member further comprises a first oblique slot, and the second movable member further comprises a second oblique slot; the first oblique slot and the first axial direction defining a first included angle therebetween, and the first pin is insertable into the first oblique slot; the second oblique slot and the first axial direction defining a second included angle therebetween, and the second pin is insertable into the second oblique slot.

3. The panel structure as claimed in claim 2, wherein the first oblique slot and the second oblique slot are both extended toward a central portion of the panel structure.

4. The panel structure as claimed in claim 2, wherein the first movable member further comprises a first indentation part connected with the first oblique slot, and wherein the second movable member further comprises a second indentation part connected with the second oblique slot.

5. The panel structure as claimed in claim 1, wherein the first movable member further comprises a plurality of first guide slots substantially parallel to the first axial direction, the second movable member further comprises a plurality of second guide slots substantially parallel to the first axial direction, and the panel body further comprises a plurality of support members which pass through the first guide slots or the second guide slots.

6. The panel structure as claimed in claim 5, wherein each support member comprises a base and a securing member, a part of the bases being abutted against the first movable member, other part of the bases being abutted against the second movable member, and each securing member being connected with the base.

7. The panel structure as claimed in claim 1, wherein the first fixing part and the second fixing part are both an engagement hook, and the first corresponding fixing part and the second corresponding fixing part are both an engagement slot for engaging each engagement hook correspondingly.

8. The panel structure as claimed in claim 1, wherein the panel body further comprises a plurality of third fixing parts, and the main housing further comprises a plurality of fixing members; the panel body being slidable relative to the main housing after being rotated to a closed position relative to the main housing, such that the plurality of third fixing parts move to combine to the plurality of fixing members, and the panel body is fixed with the main housing via the combination of the plurality of third fixing parts and the plurality of fixing members.

9. The panel structure as claimed in claim 8, wherein the panel body further comprises a plurality of restraining members for restraining movement in the first axial direction after the panel body has slid relative to the main housing.

10. An electronic device enclosure, comprising:
    a main housing comprising a first pushing member and a second pushing member; and
    a panel structure removably connected with the main housing, the panel structure comprising:
    a panel body comprising a first fixing part and a second fixing part;
    a first movable member movably connected with the panel body, the first movable member comprising a first pivoting part and a first corresponding fixing part, wherein the first movable member is movable in a first axial direction toward a first direction such that the first movable member is fixed by the first fixing part and the first corresponding fixing part, making the first pivoting part which moves along with the first movable member pivotally connected to the main housing;
    at least one first elastic member with two ends respectively connected to the first movable member and the panel body;
    a second movable member movably connected with the panel body, the second movable member comprising a second pivoting part and a second corresponding fixing part, wherein the second movable member is movable in the first axial direction toward a second direction opposite to the first direction such that the second movable member is fixed by the second fixing part and the second corresponding fixing part, making the second pivoting part which moves along with the second movable member pivotally connected to the main housing; and
    at least one second elastic member with two ends respectively connected to the second movable member and the panel body;
    wherein when the first pivoting part and the second pivoting part have both been pivotally connected to the main housing, the panel body is rotatable to a closed position relative to the main housing; when the panel body is rotated to the closed position, the first pushing member pushes the first fixing part to disengage the first fixing part from the first corresponding fixing part so as to enable the first movable member to move when the panel body slides relative to the main housing and disconnect the first pivoting part from the main housing, and the second pushing member pushes the second fixing part to disengage the second fixing part from the second corresponding fixing part so as to enable the second movable member to move when the panel body slides relative to the main housing and disconnect the second pivoting part from the main housing.

11. The electronic device enclosure as claimed in claim 10, wherein the first movable member further comprises a first oblique slot, the first oblique slot and the first direction defining a first included angle therebetween; the second movable member further comprises a second oblique slot, the second oblique slot and the second direction defining a second included angle therebetween; the main housing further comprises a first pin corresponding to the first oblique slot and a second pin corresponding to the second oblique slot; when the panel body is rotated to the closed position, the first pin is inserted into the first oblique slot and the second pin is inserted into the second oblique slot.

12. The electronic device enclosure as claimed in claim 11, wherein the first oblique slot and the second oblique slot are both extended toward a central portion of the panel structure.

13. The electronic device enclosure as claimed in claim 11, wherein the first movable member further comprises a first indentation part connected with the first oblique slot, and wherein the second movable member further comprises a second indentation part connected with the second oblique slot.

14. The electronic device enclosure as claimed in claim 10, wherein the first movable member further comprises a plurality of first guide slots substantially parallel to the first axial direction, the second movable member further comprises a plurality of second guide slots substantially parallel to the first axial direction, and the panel body further comprises a plurality of support members which pass through the first guide slots or the second guide slots.

15. The electronic device enclosure as claimed in claim 14, wherein each support member comprises a base and a securing member, each base being abutted against the first movable member, and each securing member being connected with the base.

16. The electronic device enclosure as claimed in claim 10, wherein the first fixing part and the second fixing part are each an engagement hook, and the first corresponding fixing part and the second corresponding fixing part are each an engagement slot for engaging each engagement hook correspondingly.

17. The electronic device enclosure as claimed in claim 10, wherein the panel body further comprises a plurality of third fixing parts, and wherein the main housing further comprises a plurality of auxiliary fixing members, each third fixing part of the panel body being fixed with each auxiliary fixing member of the main housing after the panel body slides relative to the main housing.

18. The electronic device enclosure as claimed in claim 17, wherein the panel body further comprises a plurality of restraining members, and wherein the main housing further comprises a plurality of corresponding restraining members, each restraining member of the panel body and each corresponding restraining member of the main housing acting jointly for restraining movement in the first axial direction after the panel body has slid relative to the main housing.

19. An electronic device comprising the electronic device enclosure described in claim 10.

* * * * *